United States Patent
Ishida

(10) Patent No.: US 12,519,470 B2
(45) Date of Patent: Jan. 6, 2026

(54) OUTPUT CIRCUIT

(71) Applicant: WILL SEMICONDUCTOR (SHANGHAI) CO. LTD., Shanghai (JP)

(72) Inventor: Manabu Ishida, Miyagi (JP)

(73) Assignee: WILL SEMICONDUCTOR (SHANGHAI) CO., LTD., Shanghai (CN)

( * ) Notice: Subject to any disclaimer, the term of this patent is extended or adjusted under 35 U.S.C. 154(b) by 6 days.

(21) Appl. No.: 18/889,103

(22) Filed: Sep. 18, 2024

(65) Prior Publication Data
US 2025/0364990 A1    Nov. 27, 2025

(30) Foreign Application Priority Data
May 22, 2024  (JP) ................ 2024-083344

(51) Int. Cl.
*H03K 17/04*    (2006.01)
*H03K 17/687*   (2006.01)

(52) U.S. Cl.
CPC ............... *H03K 17/6872* (2013.01)

(58) Field of Classification Search
CPC ............. H03K 17/04; H03K 17/041; H03K 17/04106; H03K 17/0416; H03K 17/04163; H03K 17/687; H03K 17/6871; H03K 17/6872; H03K 17/6874; H03K 17/6877
USPC ................... 327/108–112
See application file for complete search history.

(56) References Cited

U.S. PATENT DOCUMENTS 11,404,094 B2 *  8/2022  Sridharan ........... G11C 11/4096
12,153,459 B2 * 11/2024  Xiao ....................... G05F 1/563

* cited by examiner

Primary Examiner — Hai L Nguyen
(74) Attorney, Agent, or Firm — MUNCY, GEISSLER, OLDS & LOWE, P.C.

(57) ABSTRACT

The disclosure includes a p-channel output transistor MP1, of which the drain is connected to the output end; a gate drive circuit A1, which drives the gate voltage of the output transistor; and an n-channel pull-up transistor NAT, which is connected to the gate of the output transistor MP1, and is turned on when the output transistor is OFF to pull up the gate voltage. The output transistor MP1 is of an enhanced type with a relatively high threshold voltage for being turned on, and the pull-up transistor NAT is of a native type with a relatively low threshold voltage for being turned on.

3 Claims, 3 Drawing Sheets

OUTPUT CIRCUIT

BACKGROUND OF THE INVENTION

1. Field of the Invention

The disclosure relates to an output circuit using a p-channel output transistor.

2. Description of the Related Art

An output circuit that supplies an output current from an output transistor to a load and drives the load is widely used. In this case, a p-channel MOSFET (Metal-Oxide-Semiconductor Field Effect Transistor) may be used as the output transistor, and the output of a gate drive circuit may be supplied to the gate of the p-channel MOSFET.

If the source of the p-channel MOSFET is connected to a high-voltage power supply, a method of pulling up the gate of the p-channel MOSFET by a resistor or another p-channel MOSFET is generally used in order to turn off the p-channel MOSFET.

FIG. 1 is a diagram showing the configuration of a conventional output circuit. The output of a gate drive circuit A1 is supplied to the gate of a p-channel output transistor MP1. The source of the output transistor MP1 is connected to a power supply Vhv, and the drain of the output transistor MP1 is connected to the ground via a load resistor RL and becomes the output end of the output voltage Vout. Besides, the gate of the output transistor MP1 is connected to the power supply Vhv via a pull-up resistor R1. Therefore, when the output transistor MP1 is turned off, if the output of the gate drive circuit A1 is in a high impedance state, the gate of the output transistor MP1 is pulled up by the pull-up resistor R1, and the output transistor MP1 is OFF.

SUMMARY OF THE INVENTION

Problems to be Solved

When the pull-up resistor R1 is used for pulling up, if the resistance value of the pull-up resistor R1 is small, the circuit characteristic of driving the gate of the output transistor MP1 is affected. On the other hand, if the resistance value of the pull-up resistor R1 is large, it takes time to turn off the output transistor MP1.

In addition, when another p-channel transistor is used for pulling up instead of the pull-up resistor R1, a voltage clamp circuit for protecting the gate of the transistor is required. In order to clamp the voltage, it is necessary to make a current flow through a resistor to generate a clamping voltage, which causes disadvantages in terms of any one of the characteristic during operation, the turn-off speed, and the current consumption at the turn-off time.

Means to Solve Problems

An output circuit related to the disclosure includes:
a p-channel output transistor, of which the drain is connected to the output end;
a gate drive circuit, which drives the gate voltage of the output transistor; and
an n-channel pull-up transistor, which is connected to the gate of the output transistor, and is turned on when the output transistor is OFF to pull up the gate voltage, wherein the output transistor is of an enhanced type with a relatively high threshold voltage for being turned on, and
the pull-up transistor is of a native type with a relatively low threshold voltage for being turned on.

Effect

According to the output circuit related to the disclosure, the power consumption can be suppressed, and the p-channel output transistor can be turned off quickly without adversely affecting the gate drive.

PREFERRED EMBODIMENT OF THE PRESENT INVENTION

Hereinafter, embodiments of the disclosure are described with reference to the drawings. Note that, the following embodiments do not limit the scope of the disclosure, and configurations obtained by selectively combining multiple examples are also included in the disclosure.

Circuit Configuration

Figure 1:
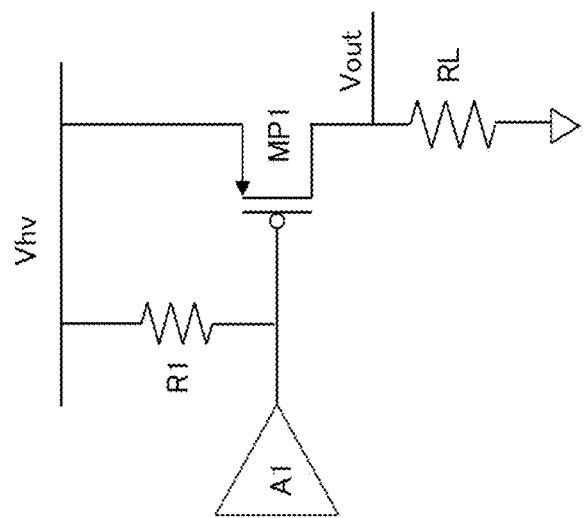
FIG. 1 is a circuit diagram showing the configuration of a conventional output circuit.
Figure 2:
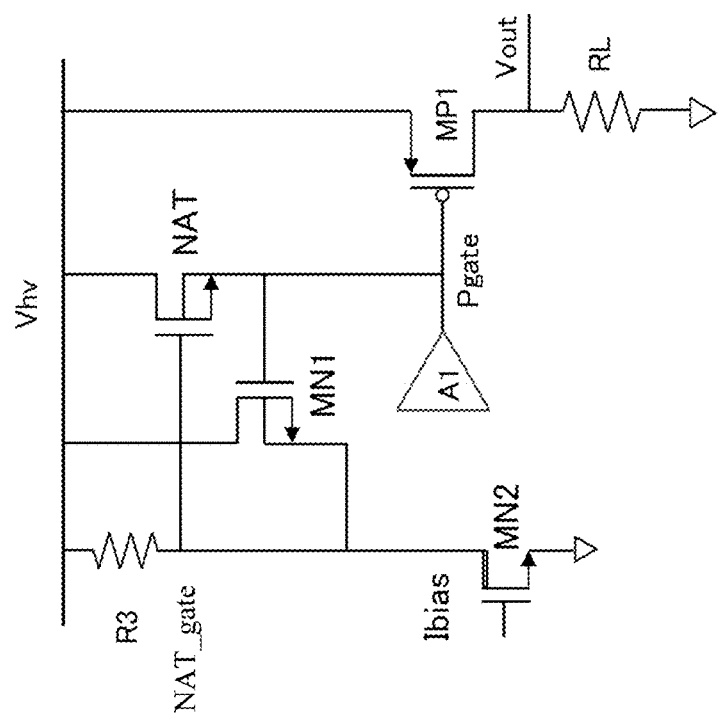
FIG. 2 is a circuit diagram showing the configuration of an output circuit according to an embodiment.

FIG. 2 is a circuit diagram showing the configuration of an output circuit according to an embodiment.

An output transistor MP1 is an output transistor that supplies a driving current to a load resistor RL. The output transistor MP1 is configured by a p-channel MOSFET and has the source connected to a high-voltage power supply Vhv and the drain connected to the ground via the load resistor RL. In addition, the drain of the output transistor MP1 becomes the output end of the output voltage Vout.

The output end of a gate drive circuit A1 is connected to the gate of the output transistor MP1. For example, the gate drive circuit A1 is configured by an operational amplifier or the like, and performs feedback control on the gate driving voltage in a manner that the output voltage Vout becomes the target voltage. Moreover, the operation of the gate drive circuit A1 is started or stopped by a signal EN described later. When the gate drive circuit A1 is OFF, the output end thereof is in a high impedance state.

The source of an n-channel pull-up transistor NAT of which the drain is connected to the high-voltage power supply Vhv is connected to the gate of the output transistor MP1. Here, the pull-up transistor NAT is a native-type n-channel MOSFET with a threshold voltage of −0.3 V to +0.1 V. Moreover, the threshold voltage of a normal enhanced-type MOSFET is 0.5 V to 1.0 V.

In addition, one end of a resistor R3 is connected to the high-voltage power supply Vhv, and the other end is connected to the ground via an n-channel transistor MN2. The signal EN is supplied to the gate of the transistor MN2. The transistor MN2 is ON when the signal EN is at a high level (EN=H), and the transistor MN2 is OFF when the signal EN is at a low level (EN=L). Moreover, in the figure, only the transistor MN2 is shown as a current source through which a current Ibias is made to flow, and the transistor MN2 can be served as a transistor through which a current of the final stage of the current source is made to flow.

The gate of an n-channel protection transistor MN1 is connected to the source of the pull-up transistor NAT. The drain of the protection transistor MN1 is connected to the high-voltage power supply Vhv, and the source thereof is connected to a connection point of the resistor R3 with the transistor MN2. Therefore, in a state where the protection transistor MN1 is ON, the voltage difference between the gate of the output transistor MP1 and the gate of the pull-up transistor NAT is maintained at a threshold voltage Vth of the protection transistor MN1.

Besides, the connection point of the resistor R3 with the transistor MN2 is connected to the gate of the pull-up transistor NAT. Therefore, when the transistor MN2 is ON, the current flowing through the transistor MN2 flows to the resistor R3, and a voltage obtained after a voltage drop by the resistor R3 is applied to the gate of the pull-up transistor NAT from the high-voltage power supply Vhv. On the other hand, when the transistor MN2 is OFF, the gate of the pull-up transistor NAT becomes the voltage of the high-voltage power supply Vhv via the resistor R3.

Moreover, the output transistors MP1, MN1, and MN2 other than the pull-up transistor NAT are enhanced-type MOSFETs.

"Circuit Operation"

Figure 3:
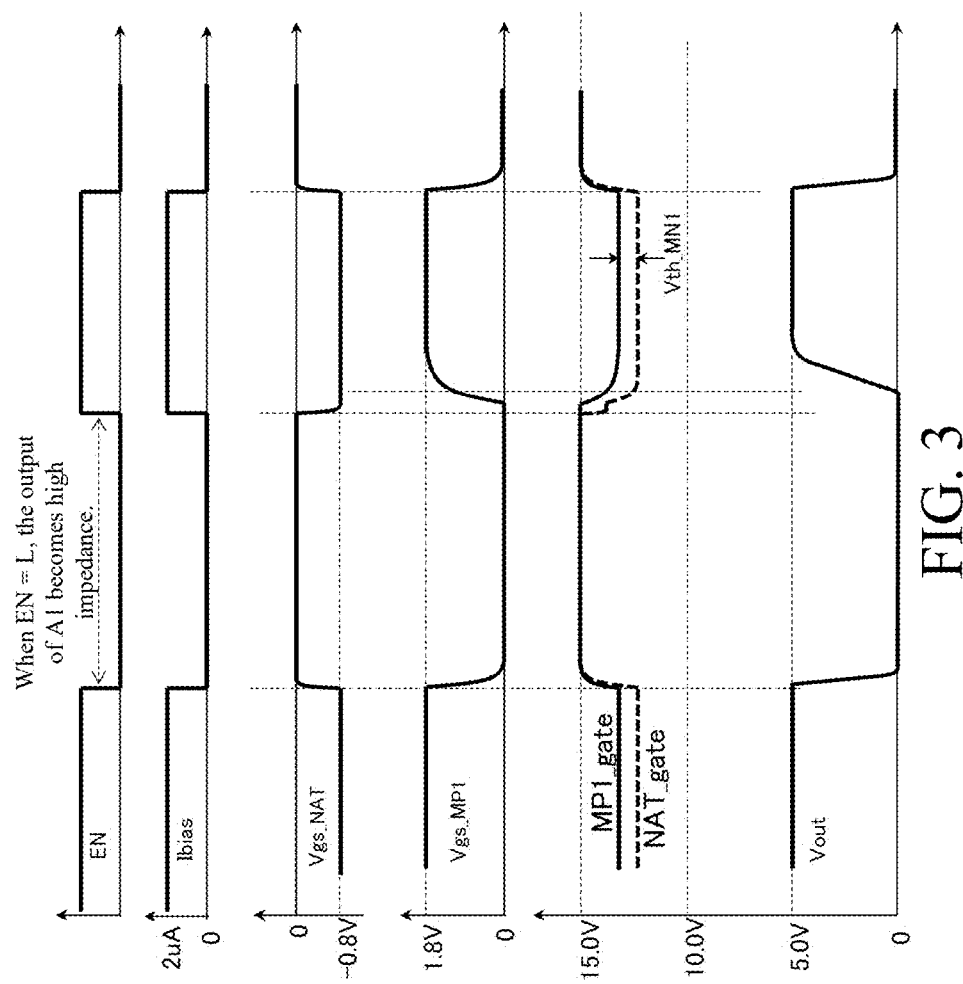
FIG. 3 is a timing chart illustrating the operation of the circuit of FIG. 2.

FIG. 3 is a timing chart illustrating the operation of the circuit of FIG. 2.

In conjunction with the high level (EN=H) and the low level (EN=L) of the signal EN, the transistor MN2 and the gate drive circuit A1 become ON or OFF.

When EN=H, the transistor MN2 is ON, and the current Ibias flows. Therefore, the gate of the pull-up transistor NAT becomes a voltage lower than the high-voltage power supply Vhv by the voltage drop at the resistor R3. The source of the pull-up transistor NAT has a voltage that is higher than Nat_gate by the gate-source voltage Vgs of the protection transistor MN1. Therefore, the gate-source voltage Vgs_NAT of the pull-up transistor NAT becomes a predetermined negative voltage (for example, −0.8 V), and the pull-up transistor NAT is OFF.

The gate (MP1_gate) of the output transistor MP1 is controlled by the gate drive circuit A1, and is set to a voltage lower than the voltage of the high-voltage power supply Vhv by a predetermined voltage in a manner that the output voltage Vout of the output transistor MP1 becomes a predetermined value (for example, 5 V).

Besides, the output voltage Vout is a target voltage (for example, 5 V) determined by the gate drive circuit A1 as described above.

Here, the voltage drop at the resistor R3 can be adjusted by changing the magnitude of the current Ibias of the transistor MN2. In the configuration in an example, a voltage up to 8 V can be generated at two ends of the resistor R3. Here, because the protection transistor MN1 is arranged, the gate voltage of the pull-up transistor NAT is maintained at a voltage lower than the gate voltage of the output transistor MP1 by the gate-source voltage Vgs of the protection transistor MN1. That is, a voltage relationship of NAT_gate=MP1_gate−Vgs is made, and NAT_gate is clamped by the protection transistor MN1 in a manner that the voltage thereof does not drop too low. Moreover, the gate-source voltage Vgs of the protection transistor MN1 in the ON state is equal to the threshold voltage Vth thereof.

Next, when EN=L, the output of the gate drive circuit A1 is in the high impedance state. In addition, the current Ibias of the transistor MN2 becomes OFF. Therefore, no voltage drop due to the resistor R3 is caused, and the gate NAT_gate of the pull-up transistor NAT quickly increases to the voltage of the high-voltage power supply Vhv. Therefore, the gate-source voltage Vgs of the pull-up transistor NAT becomes 0 V to 0.1 V.

The threshold voltage of the pull-up transistor NAT is −0.3 V to +0.1 V, the pull-up transistor NAT is ON, the gate of the output transistor MP1 is pulled up to the voltage of the high-voltage power supply Vhv (for example, 15 V), the gate-source voltage Vgs of the output transistor MP1 is 0 V to 0.1 V, and the output transistor MP1 quickly becomes OFF. Therefore, the output voltage Vout also becomes 0 V.

Accordingly, in the embodiment, the output transistor MP1 can be turned off without consuming current from the high-voltage power supply Vhv. In addition, during the turn-off, the pull-up transistor NAT operates as a source follower, so that the output transistor MP1 can be turned off sufficiently quickly.

When EN=H and the circuit operates in the normal state, the gate of the output transistor MP1 is driven with (Vhv−|max·Vgs_p|) at minimum. |max·Vgs_p| is the maximum allowable gate-source voltage of the output transistor MP1.

Moreover, the values of the current Ibias and R3 are determined in a manner that Ibias×R3 is slightly larger than |max·Vgs_p|, and thereby it is ensured that the gate voltage of the pull-up transistor NAT is always lower than the gate voltage of the output transistor MP1. Moreover, in the circuit of FIG. 2, it is prevented by the protection transistor MN1 that the gate voltage of the pull-up transistor NAT drops too low so as to avoid destruction.

By the circuit of the embodiment, the following three items can be realized when the output transistor MP1, which is a p-channel MOSFET, is turned off.

(1) The current consumption of the output transistor MP1 in the OFF state is made zero.
(2) The output transistor MP1 is quickly turned off.
(3) During normal driving of the output transistor MP1, the circuit for pulling up the output transistor MP1 does not adversely affect the driving of the gate of the output transistor MP1.

DESCRIPTION OF THE REFERENCE NUMERALS

A1 gate drive circuit
MN1 protection transistor
MP1 output transistor
NAT pull-up transistor
R1 pull-up resistor
Vhv high-voltage power supply

What is claimed is:
1. An output circuit, comprising:
a p-channel output transistor, of which the drain is connected to the output end;
in a gate drive circuit, which drives the gate voltage of the output transistor; and
an n-channel pull-up transistor, which is connected to the gate of the output transistor, and is turned on when the output transistor is OFF to pull up the gate voltage, wherein
the output transistor is of an enhanced type with a relatively high threshold voltage for being turned on, and
the pull-up transistor is of a native type with a relatively low threshold voltage for being turned on.

2. The output circuit according to claim 1, wherein
the drain of the pull-up transistor is connected to a high-voltage power supply, the source of the pull-up transistor is connected to the gate of the output transistor, and the gate of the pull-up transistor is connected to a connection point of a resistor, connected to the high-voltage power supply, with a current source.

3. The output circuit according to claim 2, further comprising:
an n-channel enhanced-type protection transistor, of which the gate is connected to the gate of the output transistor, the drain is connected to the high-voltage power supply, and the source is connected to the connection point of the resistor with the current source.

* * * * *